(12) United States Patent
Pugh

(10) Patent No.: US 11,452,222 B1
(45) Date of Patent: Sep. 20, 2022

(54) GLARE REDUCTION SHIELD

(71) Applicant: Casaundra Pugh, Richmond, VA (US)

(72) Inventor: Casaundra Pugh, Richmond, VA (US)

( * ) Notice: Subject to any disclaimer, the term of this patent is extended or adjusted under 35 U.S.C. 154(b) by 0 days.

(21) Appl. No.: 17/135,267

(22) Filed: Dec. 28, 2020

(51) Int. Cl.
*H05K 5/02* (2006.01)
*G01J 5/02* (2022.01)

(52) U.S. Cl.
CPC .......... *H05K 5/0239* (2013.01); *G01J 5/0265* (2013.01)

(58) Field of Classification Search
None
See application file for complete search history.

(56) References Cited

U.S. PATENT DOCUMENTS

| | | | |
|---|---|---|---|
| 5,905,546 A | 5/1999 | Giulie | |
| 9,891,661 B2 | 2/2018 | Schmidt | |
| 10,728,754 B2 * | 7/2020 | Lee ........................ | H04M 1/026 |
| 2003/0089832 A1 * | 5/2003 | Gold ..................... | G06F 1/1609 248/454 |
| 2009/0296220 A1 * | 12/2009 | Aguilera ............... | G06F 1/1603 359/601 |
| 2012/0163409 A1 * | 6/2012 | Lin ........................ | G01J 5/089 374/121 |
| 2015/0381785 A1 * | 12/2015 | Gander .................... | A45F 5/00 455/575.1 |
| 2016/0227663 A1 * | 8/2016 | Holmes .................. | A45C 11/00 |
| 2017/0322590 A1 * | 11/2017 | Jacobs .................. | G06F 1/1603 |
| 2019/0072996 A1 * | 3/2019 | Pickens ................ | G06F 1/1603 |
| 2020/0267335 A1 * | 8/2020 | Tang .................... | H01M 50/147 |

FOREIGN PATENT DOCUMENTS

| | | | | |
|---|---|---|---|---|
| CN | 109813443 A | * | 5/2019 | |
| CN | 212621114 U | * | 2/2021 | |
| EP | 1408368 B1 | * | 8/2005 | ............. G03B 17/56 |
| JP | 2004294903 A | * | 10/2004 | |

* cited by examiner

*Primary Examiner* — James Wu
*Assistant Examiner* — Christopher L Augustin
(74) *Attorney, Agent, or Firm* — Sanchelima & Associates, P.A.; Christian Sanchelima; Jesus Sanchelima

(57) ABSTRACT

A system for a glare reduction shield including an attaching assembly and a shield hood assembly is disclosed. The attaching assembly includes an attaching member which engages a top portion of a thermometer. Secured to the attaching member, with a hinge mechanism, is a shield hood of the shield hood assembly. The hinge mechanism is defined by a spring housing and a spring movably secured within the spring housing. The shield hood includes a lowered and raised configuration. The shield hood is used in the lowered configuration to block sunlight glare on a display screen of the thermometer for ease of viewing. The shield hood is rotated away from the attaching member about the hinge mechanism to achieve the lowered configuration. The shield hood is in the raised configuration when stored. The shield hood is rotated towards the attaching member about the hinge mechanism to achieve the raised configuration.

16 Claims, 4 Drawing Sheets

GLARE REDUCTION SHIELD

BACKGROUND OF THE INVENTION

1. Field of the Invention

The present invention relates to a glare reduction shield, more particularly, to glare reduction shield that helps to facilitate viewing and reading of the display of a digital thermometer.

2. Description of the Related Art

Several designs for glare reducing shields have been designed in the past. None of them, however, include a detachable pivoting glare reduction shield for the display screen of a hand held infrared digital thermometer wherein the shield snaps onto the top of the thermometer and comprises a three sided rectangular hood which blocks sunlight from obstructing the display screen and when not in use can be folded back away from the screen using a spring loaded hinge mechanism.

Applicant believes that a related reference corresponds to U.S. Pat. No. 5,905,546 for a detachable glare shield for a portable computer display screen. Applicant believes that another related reference refers to U.S. Pat. No. 9,891,661 for a glare reduction hood for a touch screen display panel. None of these references, however, teach of a detachable pivoting glare reduction shield having a three sided rectangular hood which blocks sunlight from obstructing the display screen of a thermometer and when not in use can be folded back away from the screen.

Other documents describing the closest subject matter provide for a number of more or less complicated features that fail to solve the problem in an efficient and economical way. None of these patents suggest the novel features of the present invention.

SUMMARY OF THE INVENTION

It is one of the objects of the present invention to provide a protective shield that helps to reduce glare on a display to facilitate viewing and reading of the display.

It is another object of this invention to provide a protective shield that can be retrofitted onto thermometers.

It is still another object of the present invention to provide a protective shield that allows for temperature measurements to be taken more efficiently.

It is yet another object of this invention to provide such a device that is inexpensive to implement and maintain while retaining its effectiveness.

Further objects of the invention will be brought out in the following part of the specification, wherein detailed description is for the purpose of fully disclosing the invention without placing limitations thereon.

BRIEF DESCRIPTION OF THE DRAWINGS

With the above and other related objects in view, the invention consists in the details of construction and combination of parts as will be more fully understood from the following description, when read in conjunction with the accompanying drawings in which.

DETAILED DESCRIPTION OF THE EMBODIMENTS OF THE INVENTION

Figure 1:
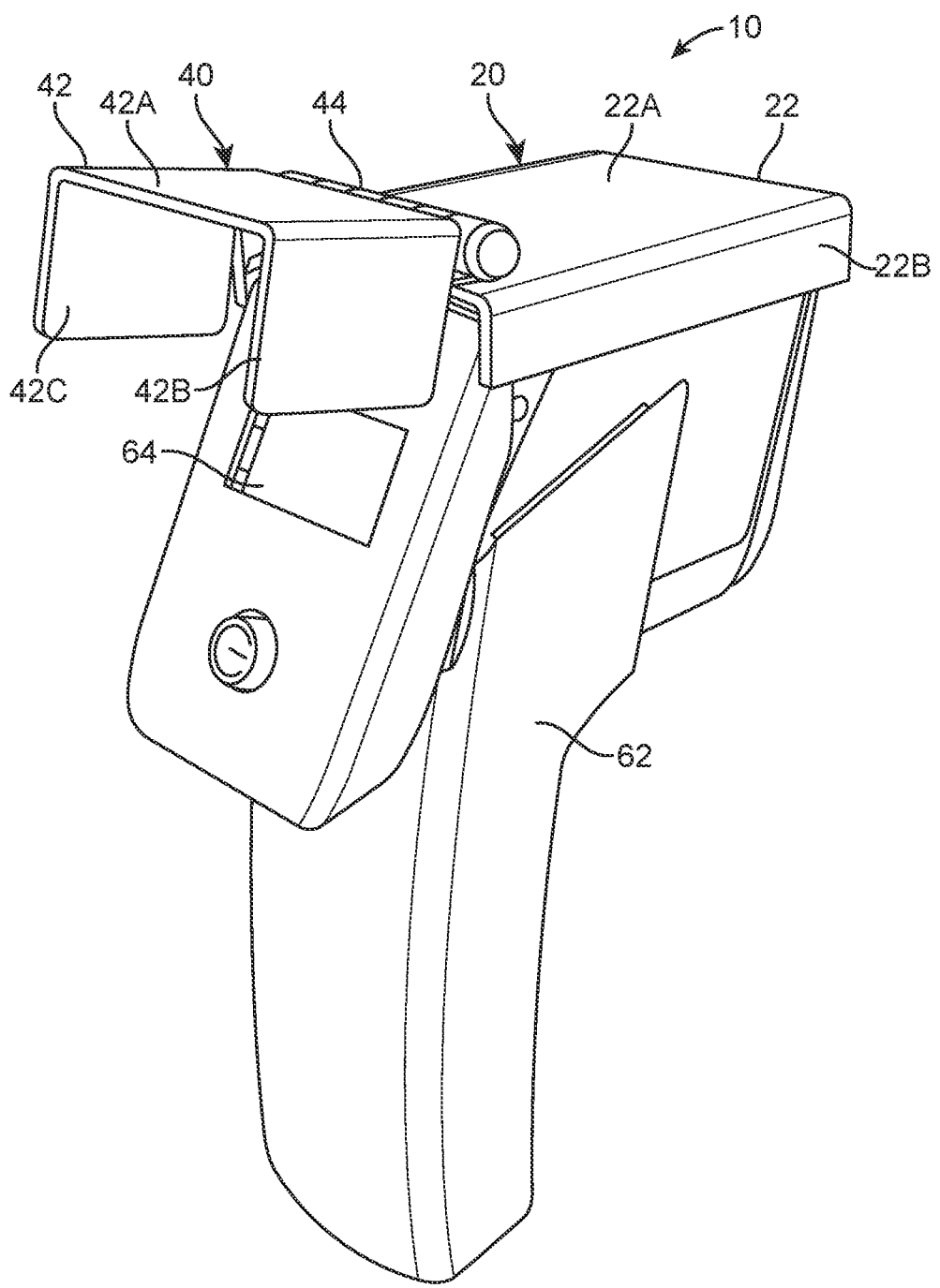
FIG. 1 represents an isometric view of glare reduction shield 10 secured to a thermometer 62.
Figure 2:
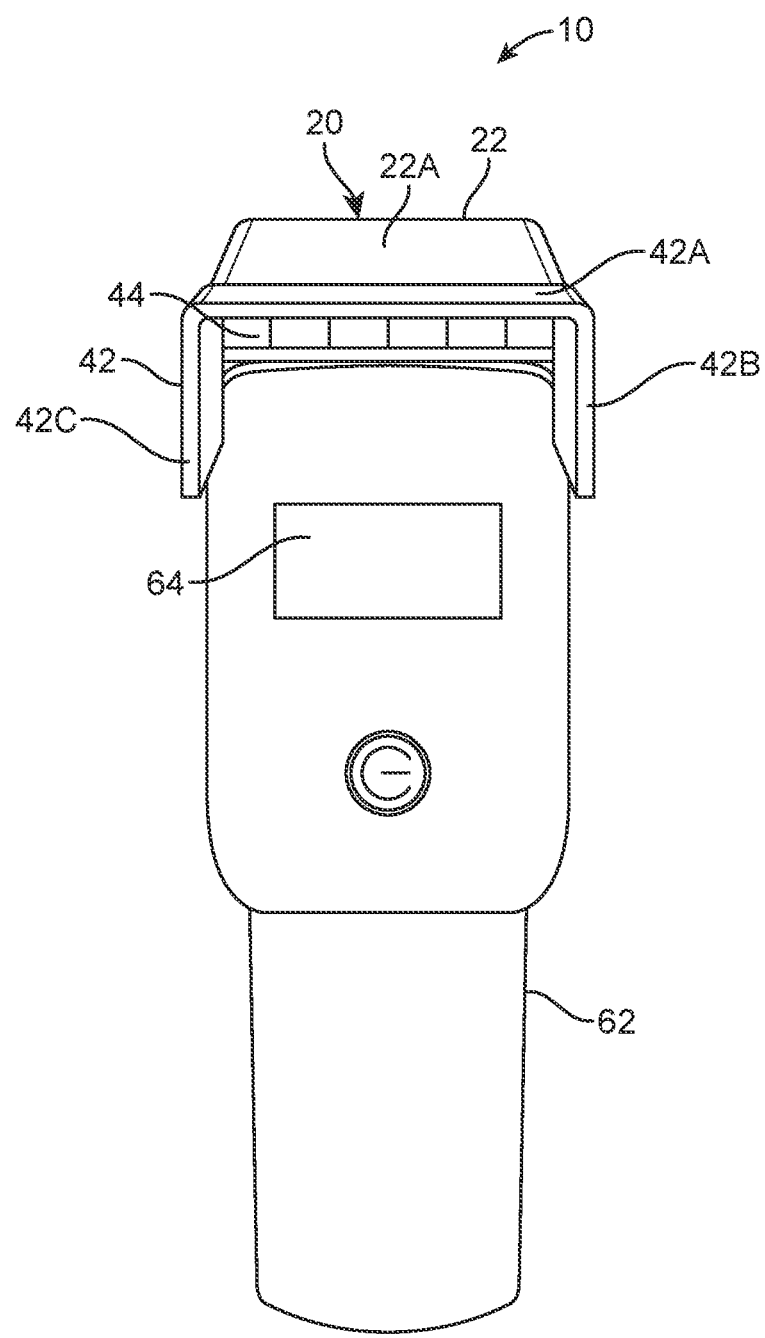
FIG. 2 shows a front view of glare reduction shield 10 secured to a thermometer 62.
Figure 3:
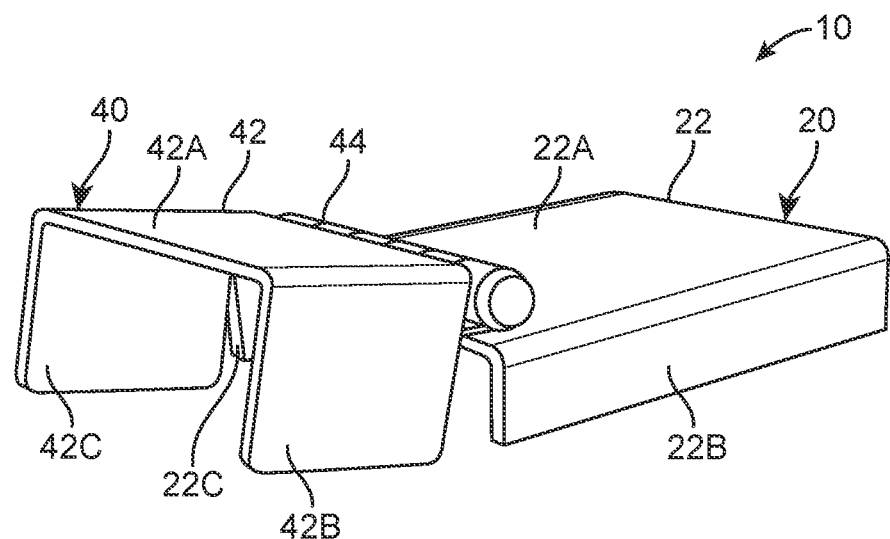
FIG. 3 illustrates an isometric view of glare reduction shield 10 with shield hood assembly 40 lowered.
Figure 4:
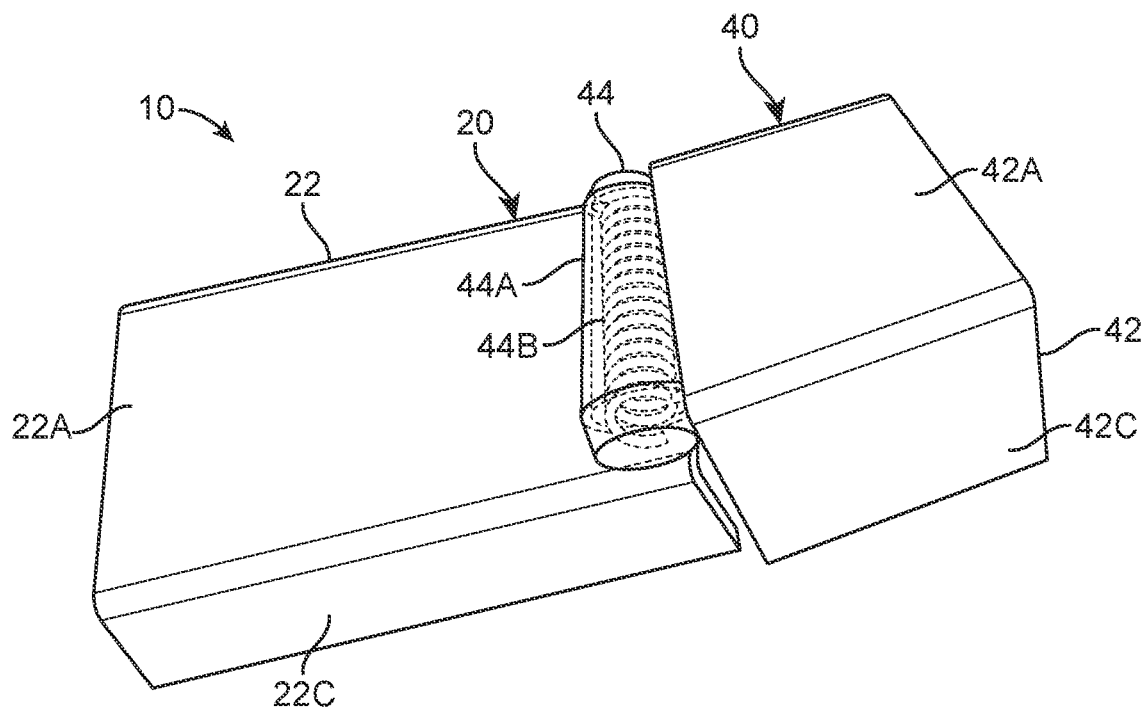
FIG. 4 is a representation of a zoomed in see through view of the hinge mechanism 44.
Figure 5:
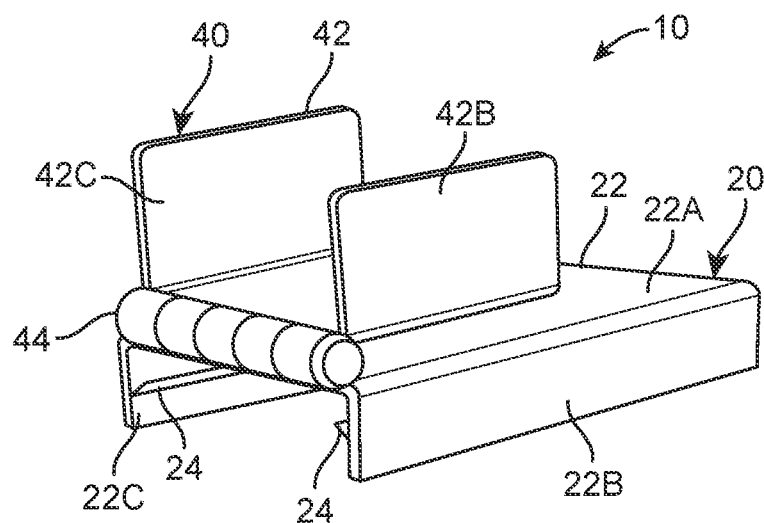
FIG. 5 illustrates an isometric view of glare reduction shield 10 with shield hood assembly 40 raised.
Figure 6:
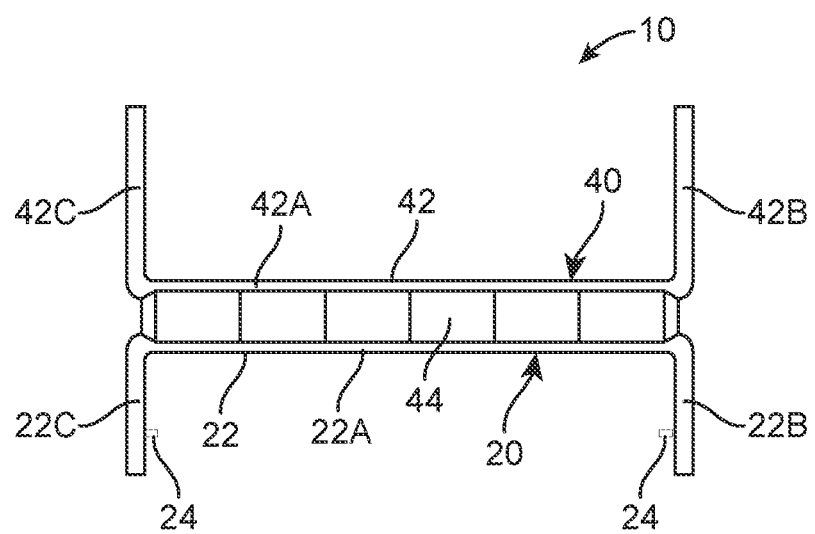
FIG. 6 shows a front view of glare reduction shield 10 with shield hood assembly 40 raised.

Referring now to the drawings, where the present invention is generally referred to with numeral 10, it can be observed that it, a glare reduction shield 10, basically includes an attaching assembly 20 and a shield hood assembly 40.

Glare reduction shield 10 may preferably be removably attached to a thermometer 62. Glare reduction shield 10 may help to facilitate viewing of the temperature readings shown on a display screen 64 of thermometer 62. Thereby allowing for thermometer 62 to easily and comfortably be used even outdoors in sunlight. Expediting the process of temperature taking in masses. In one embodiment, thermometer 62 may be an infrared digital thermometer.

To aid in securing of glare reduction shield 10 to thermometer 62, attaching assembly 20 may be used. Attaching assembly 20 may include an attaching member 22. Attaching member 22 may be U shaped in the preferred embodiment. Attaching member 22 may be defined by a base 22A, a first sidewall 22B and a second sidewall 22C. Each of base 22A, first sidewall 22B and second sidewall 22C may preferably have a rectangular configuration. First sidewall 22B and second sidewall 22C may extend downwardly and perpendicularly from lateral sides of base 22A. First sidewall 22B and second sidewall 22C may be parallel to each other. Additionally, first sidewall 22B and second sidewall 22C may define a spacing therebetween. It is to be understand that attaching member 22 may be made of materials such as plastic, aluminum, rubber or the like to remain lightweight. It is to be understood that attaching member 22 may engage a top portion of thermometer 62 between the spacing defined between first sidewall 22B and second sidewall 22C.

Attaching member 22 may be secured to thermometer 62 with pressure. It is to be understood that attaching member 22 may be slightly wider than the top portion of the thermometer 62. It can be seen that attaching member 22 may extend the entire length of the top portion of thermometer 62. In an alternative embodiment, on an inner side of attaching member 22 may at least one ridge 24 which help to secure attaching member to thermometer 62. More specifically, ridge 24 may be located at an inner portion of each of first sidewall 22B and second sidewall 22C. Preferably, ridge 24 may extend a length of each of first sidewall 22B and second sidewall 22C. First sidewall 22B and second sidewall 22C may partially extend and cover a side of thermometer 62 when secured thereto.

Secured to attaching member 22 may be shield hood assembly 40. It is to be understood that shield hood assembly 40 may be used to allow for easy reading of display screen 64 on thermometer 62 without glare, especially outdoors in sunlight. Shield hood assembly 40 may include shield hood 42. Shield hood 42 may be a three-sided rectangular hood. Shield hood 42 may be U shaped, preferably. Compared to the shape of attaching member 22, shield hood 42 may be taller and have a shorter length than attaching member 22. Shield hood 42 may be made of materials such as plastic, aluminum, rubber or the like.

Shield hood 42 may be further defined by a shield hood base 42A, a first shield hood sidewall 42B and a second shield hood sidewall 42C. Each of shield hood base 42A, first shield hood sidewall 42B and second shield hood sidewall 22C may preferably have a rectangular configuration. First shield hood sidewall 42B and second shield hood sidewall 42C may extend downwardly and perpendicularly from lateral sides of shield hood base 42A. First shield hood sidewall 42B and second shield hood sidewall 42C may be parallel to each other. Additionally, first shield hood sidewall 42B and second shield hood sidewall 42C may define a spacing therebetween. Shield hood 42 may block sunlight from directly hitting display screen 64 to facilitate reading of the temperate shown thereon. Preferably, shield hood 42 may be entirely above of display screen 64.

It is to be understood that shield hood 42 may have a lowered and a raised configuration. The lowered and raised configuration may be achieved with a hinge mechanism 44. Hinge mechanism 44 may preferably be a spring loaded hinge mechanism. Hinge mechanism 44 may further secure shield hood 42 to attaching member 22. Hinge mechanism 44 may be located atop of attaching member 22, more specifically on base 22A, at a distal end thereof. Hinge mechanism 44 may be defined by a spring housing 44A and a spring 44B. Spring housing 44A may preferably be cylindrical. Spring housing 44A may have end caps which are tapered, in one implementation. It is to be understood that spring 44B may be secured within spring housing 44A. Spring 44B may have distal ends which protrude outwardly and perpendicularly from spring housing 44A. Distal ends of spring 44B may be attached to shield hood 42. Thereby securing attaching member 22 and shield hood 42 together. It is to be understood that spring 44B is rotatable within spring housing 44A. Spring housing 44A may include slots for the distal ends of spring 44B to move within as spring 44B is being rotated to achieve the raised and lowered configuration of shield hood 42. In the lowered configuration, shield hood 42 may be rotated about hinge mechanism 44 away from attaching member 22. Attaching member 22 may be behind shield hood 42 in the lowered configuration. Preferably, when in use with thermometer 62, shield hood 42 may be in the lowered configuration to allow proper viewing of display screen 64 without glare. In the raised configuration, shield hood 42 may be rotated about hinge mechanism 44 towards attaching member 22. In the raised configuration, attaching member 22 and shield hood 42 may be stacked together. Whereby, attaching member 22 is entirely below shield hood 42, in constant abutting contact therewith. Base 22A may be in constant abutting contact with shield hood base 42A. Attaching member 22 and shield hood 42 may be stacked opposite and away from each other, in the raised configuration.

Glare reduction shield 10 can be removably secured to thermometer 62 to reduce glare from the sunlight to allow proper viewing of display screen 64. Attaching member 22 allows for glare reduction shield 10 to be retrofitted onto any existing of thermometer 62. Shield hood 42 may be lowered when needed to block the sunlight glare from reaching display screen 64. Shield hood 42 may be raised when not in use.

The foregoing description conveys the best understanding of the objectives and advantages of the present invention. Different embodiments may be made of the inventive concept of this invention. It is to be understood that all matter disclosed herein is to be interpreted merely as illustrative, and not in a limiting sense.

What is claimed is:

1. A system for a glare reduction shield, comprising:
    a. a thermometer with a display screen;
    b. an attaching assembly including an attaching member, said attaching member secured to said thermometer, said attaching member includes a base, a first sidewall and a second sidewall, said first sidewall and said second sidewall have a same length than said base; and
    c. a shield hood assembly including a shield hood, said shield hood movably attached to said attaching member with a hinge mechanism, said shield hood having a raised configuration and a lowered configuration, said shield hood moving away from said attaching member about said hinge mechanism and towards said display screen to achieve the lowered configuration to block sunlight glare from the display to facilitate viewing and reading of said display screen, said raised configuration achieved when said shield hood is stored, wherein said shield hood includes a shield hood base, a first shield hood sidewall and a second shield hood sidewall, wherein said shield hood base has a same width than the base of said attaching member, wherein said hinge mechanism connects an entire width of said shield hood base with a second entire width of the base of said attaching member.

2. The system of claim 1, wherein said first sidewall and said second sidewall extend perpendicularly and downwardly from lateral sides of said base.

3. The system of claim 1, wherein said first sidewall and said second sidewall are parallel to each other.

4. The system of claim 1, wherein said first sidewall and said second sidewall define a spacing therebetween, said thermometer received within said spacing.

5. The system of claim 1, wherein said attaching member is U shaped.

6. The system of claim 1, wherein said attaching member partially covers said thermometer.

7. The system of claim 1, wherein said attaching member includes at least one ridge along a length of an inner portion of said attaching member.

8. The system of claim 7, wherein said at least one ridge extends along said first side wall and said second sidewall.

9. The system of claim 1, wherein said first shield hood sidewall and said second shield hood sidewall extend perpendicularly and downwardly from lateral sides of said shield hood base.

10. The system of claim 1, wherein said shield hood move towards said attaching member about said hinge mechanism to achieve the raised configuration.

11. The system of claim 1, wherein said hinge mechanism is defined by a spring housing and a spring.

12. The system of claim 11, wherein said spring is secured within the spring housing, said spring rotatable within said spring housing as said shield hood achieves said lowered configuration or said raised configuration.

13. The system of claim 1, wherein said attaching member and said shield hood are in constant abutting contact with one another and stacked away from each other in the raised configuration.

14. The system of claim 1, wherein said shield hood is entirely above of said display screen in the lowered configuration.

15. A system for a glare reduction shield, comprising:
a) a thermometer with a display screen, said thermometer being an infrared digital thermometer;
b) an attaching assembly including an attaching member, said attaching member defined by a base, a first sidewall and a second sidewall, said first sidewall and said second sidewall have a same length than said base, said first sidewall and said second sidewall extending downwardly and perpendicularly from lateral edges of said base, a spacing defined between said first sidewall and said second sidewall, said thermometer received between said spacing to secure said attaching member to said thermometer, said attaching member includes at least one ridge along a length of an inner portion of said attaching member, wherein said at least one ridge extends along said first side wall and said second sidewall; and
c) a shield hood assembly including a shield hood, said shield hood defined by a shield hood base, a first shield hood sidewall, a second shield hood sidewall, said first shield hood sidewall and said second shield hood being parallel to each other, said shield hood movably attached to said attaching member with a hinge mechanism, said hinge mechanism including a spring housing and a spring within the spring housing, said shield hood having a raised configuration and a lowered configuration, said shield hood moving away from said attaching member about said hinge mechanism and towards said display screen to achieve the lowered configuration to block sunlight glare from the display to facilitate viewing and reading of said display screen, said raised configuration achieved when said shield hood is stored, wherein said shield hood base has a same width than the base of said attaching member, wherein said hinge mechanism connects an entire width of said shield hood base with a second entire width of the base of said attaching member.

16. A system for a glare reduction shield, consisting of:
a. a thermometer with a display screen;
b. an attaching assembly including an attaching member, said attaching member defined by a base, a first sidewall and a second sidewall, said first sidewall and said second sidewall have a same length than said base, said first sidewall and said second sidewall extending downwardly and perpendicularly from lateral edges of said base, a spacing defined between said first sidewall and said second sidewall, said thermometer received between said spacing to secure said attaching member to a top portion of said thermometer, said attaching member includes at least one ridge along a length of an inner portion of said attaching member, wherein said at least one ridge extends along said first side wall and said second sidewall; and
c. a shield hood assembly including a shield hood, said shield hood defined by a shield hood base, a first shield hood sidewall, a second shield hood sidewall, said first shield hood sidewall and said second shield hood being parallel to each other, said shield hood movably attached to said attaching member with a hinge mechanism, said hinge mechanism including a spring housing and a spring within the spring housing, said shield hood having a raised configuration and a lowered configuration, said shield hood moving away from said attaching member about said hinge mechanism and towards said display screen to achieve the lowered configuration to block sunlight glare from the display to facilitate viewing and reading of said display screen, said raised configuration achieved when said shield hood is stored wherein said shield hood base has a same width than the base of said attaching member, wherein said hinge mechanism connects an entire width of said shield hood base with a second entire width of the base of said attaching member.

* * * * *